United States Patent
Lee et al.

(10) Patent No.: US 11,056,424 B2
(45) Date of Patent: Jul. 6, 2021

(54) DISPLAY DEVICE

(71) Applicant: Samsung Display Co., Ltd., Yongin-si (KR)

(72) Inventors: Kyung Mok Lee, Bucheon-si (KR); Dae Geun Lee, Hwaseong-si (KR)

(73) Assignee: SAMSUNG DISPLAY CO., LTD.

( * ) Notice: Subject to any disclaimer, the term of this patent is extended or adjusted under 35 U.S.C. 154(b) by 26 days.

(21) Appl. No.: 16/359,898

(22) Filed: Mar. 20, 2019

(65) Prior Publication Data
US 2019/0348357 A1 Nov. 14, 2019

(30) Foreign Application Priority Data
May 9, 2018 (KR) .......... 10-2018-0053169

(51) Int. Cl.
| | |
|---|---|
| *H01L 23/00* | (2006.01) |
| *H01L 23/498* | (2006.01) |
| *H05K 1/02* | (2006.01) |
| *G01R 31/26* | (2020.01) |

(52) U.S. Cl.
CPC .... *H01L 23/49838* (2013.01); *G01R 31/2644* (2013.01); *H01L 23/4985* (2013.01); *H05K 1/0268* (2013.01); *H05K 2201/09409* (2013.01)

(58) Field of Classification Search
CPC .......... H01L 23/49838; H01L 23/4985; G01R 31/2644; H05K 1/0268; H05K 2201/09409
See application file for complete search history.

(56) References Cited

U.S. PATENT DOCUMENTS

| | | | |
|---|---|---|---|
| 2015/0279258 A1* | 10/2015 | Shin ........................ | G09G 3/006 324/755.01 |
| 2017/0196080 A1* | 7/2017 | Meng ...................... | H05K 1/181 |
| 2017/0223824 A1* | 8/2017 | Ono ........................ | H05K 1/118 |
| 2018/0286939 A1 | 10/2018 | Lee et al. | |
| 2019/0088584 A1* | 3/2019 | Won ....................... | H01L 27/124 |
| 2019/0285917 A1* | 9/2019 | Sun ........................ | G02F 1/1309 |

FOREIGN PATENT DOCUMENTS

KR 10-2018-0110710 10/2018

* cited by examiner

*Primary Examiner* — Pete T Lee
(74) *Attorney, Agent, or Firm* — H.C. Park & Associates, PLC

(57) ABSTRACT

A display device including a display panel having panel pad units including a first panel pad unit having first pads arranged in a first column and a second panel pad unit having second pads arranged in a second column; a first member coupled to at least one of the first and second panel pad units; and a second member coupled to the first member and including a plurality of test pads, and wherein the first member includes lines electrically connecting a respective one of the plurality of test pads with a respective one of the first and second pads.

17 Claims, 13 Drawing Sheets

DISPLAY DEVICE

CROSS REFERENCE TO RELATED APPLICATION

This application claims priority from and the benefit of Korean Patent Application No. 10-2018-0053169, filed on May 9, 2018, which is hereby incorporated by reference for all purposes as if fully set forth herein.

BACKGROUND

Field

Exemplary implementations of the invention relate generally to a display device, and more specifically, to a display device including an integrated driving circuit.

Discussion of the Background

A display device includes a driving circuit. The driving circuit supplies signals to thin-film transistors and a plurality of signal lines on a display panel. The driving circuit may be implemented as an integrated circuit (IC) chip. The driving circuit can be mounted on a substrate of an electronic device or a printed circuit board (PCB) by various packaging methods. For example, the driving circuit may be mounted directly on the substrate of a display device by using COG (chip-on-glass) technology or may be mounted on a film such as a flexible printed circuit film by using COF (chip-on-film) technology. The process of electrically connecting the substrate of a display device with the output terminals of the drive IC chip is referred to as an OLB (outer lead bonding) process.

The above information disclosed in this Background section is only for understanding of the background of the inventive concepts, and, therefore, it may contain information that does not constitute prior art.

SUMMARY

Display devices constructed according to the principles and exemplary implementations of the invention facilitate inspection of the electrical connections between the substrate of the display device and the drive IC chip.

For example, exemplary implementations of display devices of the invention have a two-column connection pad structure in which the outer lead bonding (OLB) in each of the columns can be individually checked. In particular, according to one exemplary embodiment, the connection resistance between the leads and pads excluding the noise resistance components can be measured by using four-terminal sensing. If the measured connection resistance of one of the OLB coupling portions deviates from a predetermined range, it may be determined that the OLB process has not been properly carried out. As a result, it is possible to check the OLB in each of the first and second columns individually.

Additional features of the inventive concepts will be set forth in the description which follows, and in part will be apparent from the description, or may be learned by practice of the inventive concepts.

According to an exemplary embodiment of the invention, a display device includes a display panel having panel pad units including a first panel pad unit having first pads arranged in a first column and a second panel pad unit having second pads arranged in a second column; a first member coupled to at least one of the first and second panel pad units; and a second member coupled to the first member and including a plurality of test pads, and wherein the first member includes lines electrically connecting a respective one of the plurality of test pads with a respective one of the first and second pads.

The first member may include a first film, the second member may include a second film, and the first pads arranged in the first panel pad unit and the second pads arranged in the second panel pad unit are electrically connected to different test pads of the plurality of test pads, respectively.

The first panel pad unit may include a first panel inspection pad, a second panel inspection pad and a third panel inspection pad, and wherein the second panel pad unit may include a fourth panel inspection pad, a fifth panel inspection pad and a sixth panel inspection pad.

The first panel inspection pad, the second panel inspection pad and the third panel inspection pad may be connected to a first panel line, and wherein the fourth panel inspection pad, the fifth panel inspection pad and the sixth panel inspection pad may be connected to a second panel line.

The display device may further include a third panel pad unit having third pads arranged in a third column.

The first panel pad unit may further include a first panel dummy pad, and wherein the second panel pad unit may further include a second panel dummy pad.

The first panel dummy pad may be disposed adjacent to the second panel inspection pad, and wherein the second panel dummy pad may be disposed adjacent to the fifth panel inspection pad.

The first panel dummy pad may be disposed between the second panel inspection pad and the third panel inspection pad, and wherein the second panel dummy pad may be disposed between the fifth panel inspection pad and the sixth panel inspection pad.

The first panel dummy pad may not be connected to the plurality of first and second pads, and wherein the second panel dummy pad may not be connected to the plurality of first and second pads.

The second panel inspection pad may be connected to a line having branches, and wherein the fifth panel inspection pad may be connected to another line having branches.

The plurality of test pads may not be coupled with the first member and include an exposed portion.

The test pads electrically connected to the first panel pad unit may be connected to a first constant current source, a first ground contact portion, a first voltage measurement portion and a second voltage measurement portion, and wherein the test pads electrically connected to the second panel pad unit may be connected to a second constant current source, a second ground contact portion, a third voltage measurement portion, and a fourth voltage measurement portion.

At least two of the plurality of test pads may be capable of being in contact with two or more measurement terminals.

According to another exemplary embodiment of the present disclosure, a display device includes: a display panel having a plurality of test pads; an integrated circuit to drive the display panel; a connector electrically communicating the display panel and the integrated circuit; and a first test pad of the plurality of test pads being connected to a first constant current source, a second test pad of the plurality of test pads being connected to a first ground contact portion, a third test pad of the plurality of test pads acts comprises a first voltage measurement portion, and a fourth test pad of the plurality of test pads comprises a second voltage measurement portion.

The integrated circuit may include a first film, and the connector may include a second film.

The display device may further include panel pad units including a first panel pad unit having first pads arranged in a first column, and a second panel pad unit having second pads arranged in a second column, the first panel pad unit further include a first panel dummy pad, and wherein the second panel pad unit further include a second panel dummy pad, the first panel dummy pad may be disposed adjacent to a panel inspection pad, and wherein the second panel dummy pad may be disposed adjacent to a fourth panel inspection pad, the first panel inspection pad, the second panel inspection pad, the third panel inspection pad and the fourth panel inspection pad may be connected to one another through panel lines.

The first panel dummy pad may not be connected to the plurality of first and second pads, and wherein the second panel dummy pad may not be connected to the plurality of first and second pads.

The second panel inspection pad may be connected to a line having branches, and wherein the fourth panel inspection pad may be connected to another line having branches.

The display device may further include a first member coupled to the panel pad units, wherein the test pads may not be coupled with the first member and may include an exposed portion.

At least two of the plurality of test pads may be capable of being in contact with two or more measurement terminals.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
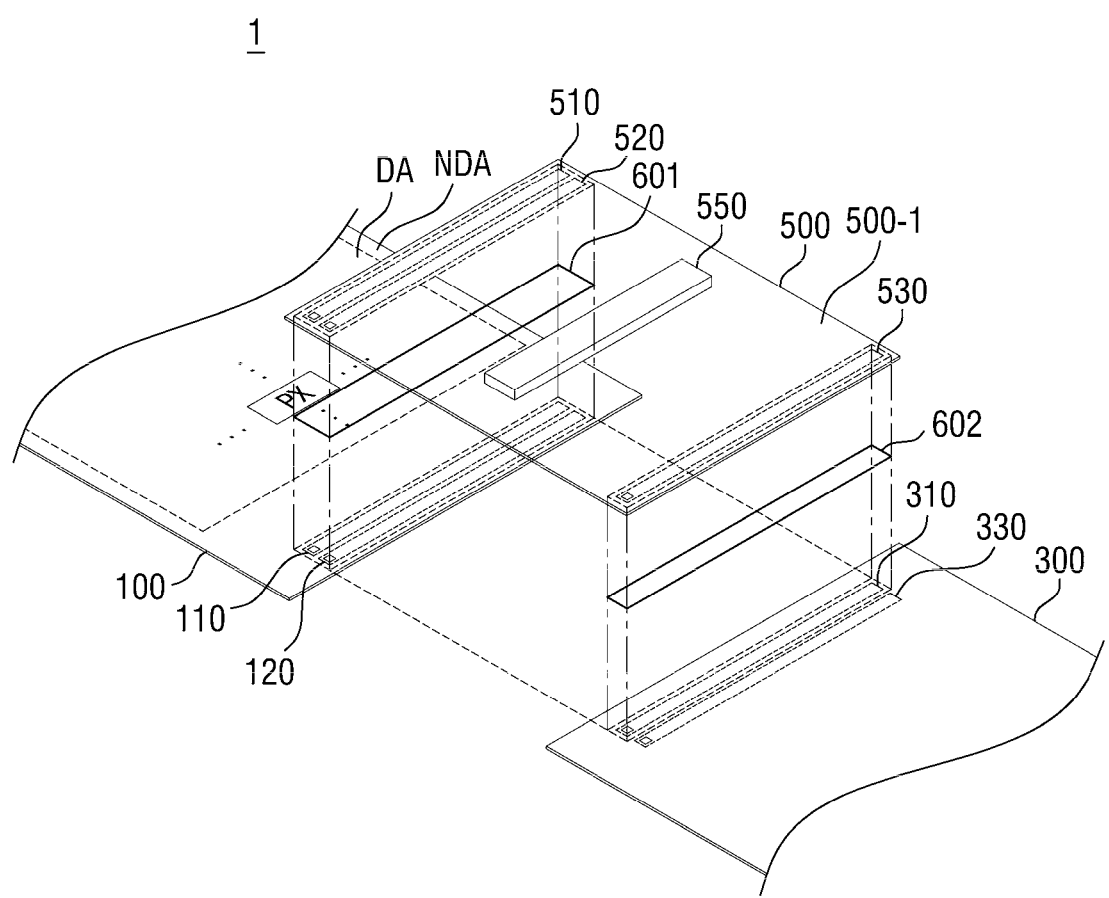
FIG. 1 is a perspective view of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the invention will be described with reference to the accompanying drawings.

FIG. 1 is a perspective view of a display device constructed according to an exemplary embodiment of the invention.

Referring to FIG. 1, a display device 1 according to an exemplary embodiment of the invention includes a display panel 100, a driving circuit board 300, a COF film 500, and anisotropic conductive films (ACF) 601 and 602.

The display panel 100 includes a display area DA and a non-display area NDA. The display area DA includes a plurality of pixels PX. The non-display area NDA is a peripheral area adjacent to the display area DA. The non-display area NDA may include panel pad units 110 and 120 to which the COF film 500 is attached. The panel pad units 110 may be disposed on one end of the display panel 100.

The panel pad units 110 and 120 may include a plurality of pads arranged in columns extending in one direction. The panel pad units 110 and 120 may include a plurality of columns or a single column. According to the exemplary embodiment shown in FIG. 1, the panel pad units 110 and 120 are arranged in two columns of a first column 110 and a second column 120. The first column 110 of the panel pad units may be a first panel pad unit. The second column 120 of the panel pad units may be a second panel pad unit. The panel pad units 110 and 120 may be electrically connected to the pixels PX in the display area DA through a fan-out line and a signal line. The pads of the panel pad units 110 and 120 may be electrically connected to one another.

The driving circuit board 300 may include a PCB pad unit 310 for electrically connecting to the COF film 500. The PCB pad unit 310 may be located at one end of the driving circuit board 300. The PCB pad unit 310 may include a plurality of pads arranged in a column extending in one direction. The PCB pad unit 310 may include a plurality of columns or a single column. According to the exemplary embodiment shown in FIG. 1, the PCB pad unit 310 has a single-column structure.

The driving circuit board 300 may further include a test pad unit 330 for measuring the connection resistance between the display panel 100 and the COF film 500. The test pad unit 330 may include a test pattern formed to measure the connection resistance between the display panel 100 and the COF film 500. The test pad unit 330 may not be coupled with the COF film 500 and may form an exposed portion to connect to the measurement equipment for checking if the OLB process was properly carried out. The test pad unit 330 may be located at one end of the driving circuit board 300 and may be located more to the inside of the driving circuit board 300 than the PCB pad unit 310. The PCB pad unit 310 may be disposed in parallel with the test pad unit 330.

The test pad unit 330 may include a plurality of pads arranged in a column extending in one direction. The test pad unit 330 may include a plurality of columns or a single column. According to the exemplary embodiment shown in FIG. 1, the test pad unit 330 having a single-column structure is shown. The test pad unit 330 may be electrically connected to the PCB pad unit 310.

Although the arrangements of the PCB pad unit 310 and the test pad unit 330 may be substantially identical to the arrangement of the above-described panel pad units 110 and 120, the invention is not limited thereto.

The COF film 500 includes a film body 500-1, a driving integrated circuit 550, panel lead units 510 and 520, and a PCB lead unit 530. The driving integrated circuit 550 may be disposed on the film body 500-1 of the COF film 500 by using COF (chip-on-film) technology. As another example, the driving integrated circuit 550 may be attached directly on the display panel 110 by using COG (chip-on-glass) technology if the substrate of the display panel is a glass substrate or by using COP (chip-on-plastic) technology if the substrate of the display panel is a flexible plastic substrate.

The driving integrated circuit 550 may be attached to the upper surface of the film body 500-1 of the COF film 500 and/or may also be attached to the lower surface. The driving integrated circuit 550 may be directly connected to the COF film 500. In addition, a conductive material, for example, may be interposed between the COF film 500 and the driving integrated circuit 550 so as to electrically connect them.

The driver integrated circuit 550 may be in the form of an integrated circuit chip. The driving integrated circuit 550 may include a data driver for generating a data signal and/or a scan driver for generating a scan signal in response to the driving power and signals transmitted from the driving circuit board 300. The driving integrated circuit 550 may supply the scan signal and the data signal generated in the scan driver and the data driver, respectively, to the display panel 100. The driving integrated circuit 550 may be electrically connected to the panel lead units 510 and 520 and the PCB lead unit 530.

The panel lead units 510 and 520 and the PCB lead unit 530 may be disposed at the ends of the lines extended from the driving integrated circuit 550, respectively. The panel lead units 510 and 520 and the PCB lead unit 530 may be disposed on the lower surface of the film body 500-1. The panel lead units 510 and 520 may be disposed on the end of the film body 500-1 closer to the display panel 100. The PCB lead unit 530 may be disposed on the end of the film body 500-1 closer to the driving circuit board 300. When the COF film 500 is attached to the display panel 100 and the driving circuit board 300, the panel lead units 510 and 520 face the panel pad units 110 and 120, and the PCB lead unit 530 faces the PCB pad unit 310.

Each of the leads of the panel lead units 510 and 520 and the PCB lead unit 530 may have a shape that can be easily coupled with the respective pads. Their shape and structure are not limited to those shown in FIG. 1.

The panel pad units 510 and 520 may include a plurality of leads arranged in columns extending in one direction. The panel lead units 510 and 520 may include a plurality of columns or a single column. According to the exemplary embodiment shown in FIG. 1, panel lead units 510 and 520 having a two-column structure is shown. The panel lead units 510 and 520 may be electrically connected to the panel pad unit 110 and 120, respectively. The first column 510 and the second column 520 of the panel lead units 510 and 520 may be electrically connected to the first column of the panel pad unit 110 and the second column of the panel pad unit 120, respectively.

The PCB lead unit 530 may include a plurality of leads arranged in a column extending in one direction. The PCB lead unit 530 may include a plurality of columns or a single column. According to the exemplary embodiment shown in FIG. 1, PCB lead unit 530 has a single-column structure. The PCB lead unit 530 may be electrically connected to the PCB pad unit 310.

The first anisotropic conductive film (ACF) 601 may be disposed between the panel lead units 510 and 520 and the panel pad units 110 and 120. In addition, the second anisotropic conductive film 602 may be disposed between the PCB lead unit 530 and the PCB pad unit 310. Each of the anisotropic conductive films 601 and 602 may include an epoxy resin layer having excellent insulating properties and adhesiveness and conductive balls dispersed therein. By disposing the anisotropic conductive films 601 and 602 between the leads and the pads, the leads and the pads may form bonding areas when pressed together, and may be electrically connected by conductive balls. The lead/pad bonding areas may be insulated from the pads by an epoxy resin layer which is the major component of the anisotropic conductive films 601 and 602. In some exemplary embodiments, the anisotropic conductive films 601 and 602 may further include a moisture absorbent dispersed in the resin layer. The display panel 100, the COF film 500, and the driving circuit board 300 may be electrically connected to one another through the anisotropic conductive films 601 and 602.

Figure 2:
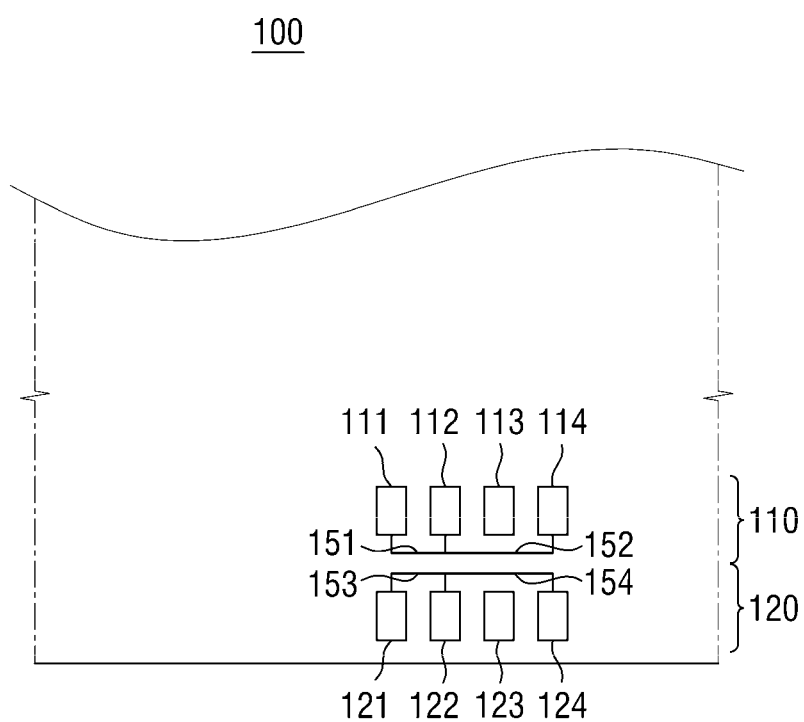
FIG. 2 is a plan view of the display panel in FIG. 1.

FIG. 2 is a plan view of the display panel in FIG. 1.

Referring to FIG. 2, the display panel 100 includes panel pad units 110 and 120 each including a plurality of pads, and panel lines 151, 152, 153 and 154 connecting between the pads.

The panel pad units 110 and 120 may be arranged in a first column and a second column, respectively. In an exemplary embodiment, the panel pad units 110 and 120 may include four pads for each column, as shown in FIG. 2. It is to be understood that the number of the pads is not limited to four.

In an exemplary embodiment, the first column of the panel pad units 110 may include a first panel inspection pad 111, a second panel inspection pad 112, a third panel inspection pad 114 and a first panel dummy pad 113. The second column of the panel pad units 120 may include a fourth panel inspection pad 121, a fifth panel inspection pad 122, a sixth panel inspection pad 124 and a second panel dummy pad 123. The pads of the columns may have substantially the same shape and may be equally spaced apart from one another. As the pads are equally spaced apart from one another, the COF film 500 can be attached more reliably.

The first panel dummy pad 113 and the second panel dummy pad 123 may not be connected to the panel lines 151, 152, 153 and 154. The first panel dummy pad 113 may be disposed between the second panel inspection pad 112 and the third panel inspection pad 114. The second panel dummy pad 123 may be disposed between the fourth panel inspection pad 121 and the sixth panel inspection pad 124. The first panel dummy pad 113 and the second panel dummy pad 123 may maintain the spacing between the pads in each of the columns. For example, different pads may have different connection lines or branch lines (see lines 546 and 547 in FIG. 4). A pad to which a branch line is connected may require a larger space than a pad with no branch line. Therefore, by disposing the panel dummy pads adjacent to the pads to which branch lines are connected, it is possible to obtain and to maintain the spacing between the pads.

The panel inspection pads 111, 112, 114, 121, 122 and 124 and the panel dummy pads 113 and 123 may be disposed at the edges of the panel pad units 110 and 120. The edges of the panel pad units 110 and 120 are more vulnerable to external shock than the center portion. Accordingly, it is possible to more effectively check if the OLB process has been properly carried out.

Referring to FIG. 2, the panel lines may include first to fourth panel lines 151, 152, 153 and 154. The first panel line 151 and the second panel line 152 may be implemented as a single line. The third panel line 153 and the fourth panel line 154 may be implemented as a single line. The first panel line 151 and the second panel line 152 may electrically connect the first to third panel inspection pads 111, 112 and 114 with one another. In the example shown in FIG. 2, the first panel line 151 electrically connects the first panel inspection pad 111 with the second panel inspection pad 112, and the second panel line 152 electrically connects the second panel inspection pad 112 with the third panel inspection pad 114. The third panel line 153 and the second panel line 154 may electrically connect the fourth to sixth panel inspection pads 121, 122 and 124 with one another. In the example shown in FIG. 2, the third panel line 153 electrically connects the fourth panel inspection pad 121 with the fifth panel inspection pad 122, and the fourth panel line 154 electrically connects the fourth panel inspection pad 122 with the sixth panel inspection pad 124. The first panel line 151 and the second panel line 152 may be spaced apart from the third panel line 153 and the fourth panel line 154.

Figure 3:
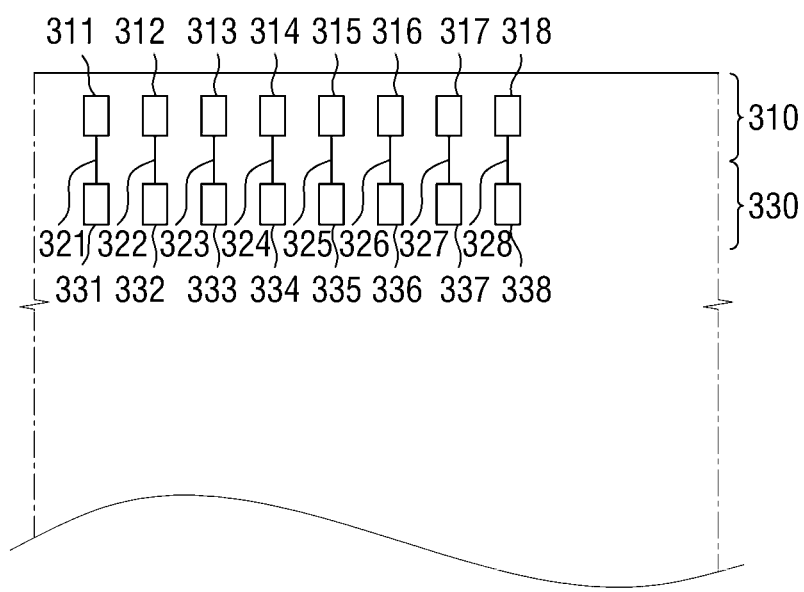
FIG. 3 is a plan view of the driving circuit in FIG. 1.

FIG. 3 is a plan view of the driving circuit board in FIG. 1.

Referring to FIG. 3, the driving circuit board 300 may include a PCB pad unit 310, a test pad unit 330, and PCB lines 321, 322, 323, 324, 325, 326, 327 and 328. The PCB pad unit 310 may include first to eighth PCB test pads 311, 312, 313, 314, 315, 316, 317 and 318. The test pad unit 330 may include first to eighth test pads 331, 332, 333, 334, 335, 336, 337 and 338. The test pad unit 330 may include pads for contact with measurement equipment in order to check if the OLB process of the display device 100 has been properly carried out. A constant current may be applied to the display device 1 through the test pads or the voltage difference between the pads may be checked. The first to eighth PCB test pads 311, 312, 313, 314, 315, 316, 317 and 318 may be electrically connected to the first to eighth test pads 331, 332, 333, 334, 335, 336, 337 and 328 via the first to eighth PCB lines 321, 322, 323, 324, 325, 326, 327 and 328, respectively. The PCB lines 321, 322, 323, 324, 325, 326, 327 and 328 may be disposed between the PCB pad unit 310 and the test pad unit 330, to electrically connect them. The driving circuit board 300 may be a flexible printed circuit board (FPC). The driving circuit board 300 may be a deformable substrate or film that can be rolled, folded, bent and so on.

Figure 4:
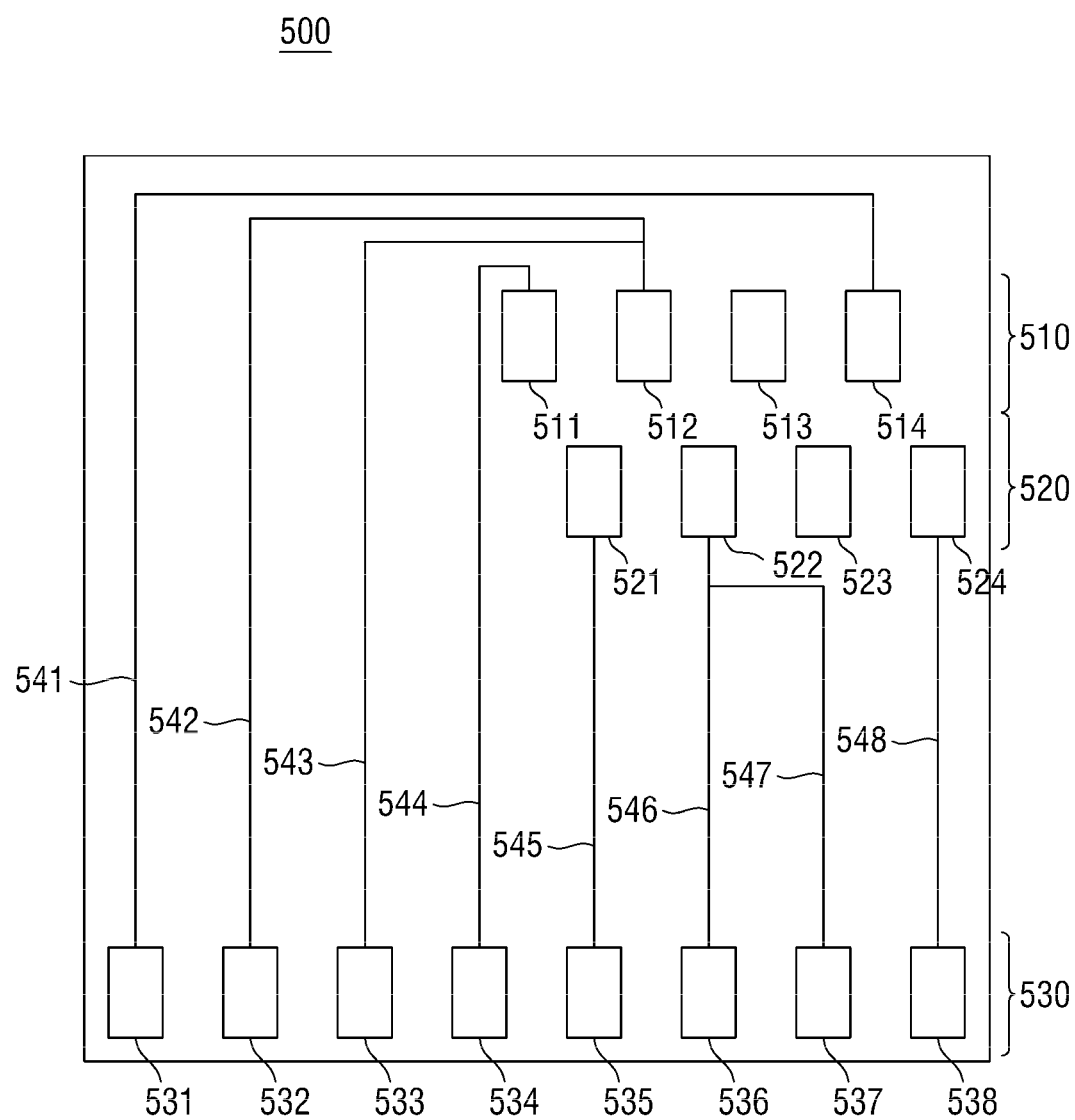
FIG. 4 is a plan view of a COF film in FIG. 1.

FIG. 4 is a plan view of a COF film in FIG. 1.

For convenience of illustration, the driving integrated circuit 550 is not shown in FIG. 4.

Referring to FIG. 4, the COF film 500 may include panel lead units 510 and 520, the PCB lead unit 530 and the film lines 541, 542, 543, 544, 545, 546, 547 and 548. The film body 500-1 of the COF film 500 may be made of, but is not limited to, polyethylene terephthalate (PET), polyimide (PI), polycarbonate (PC), polyethylene (PE), polypropylene (PP), polysulfone (PSF), polymethylmethacrylate (PMMA), triacetylcellulose (TAC), cycloolefin polymer (COP), etc.

The panel lead units 510 and 520 may be electrically connected to the panel pad units 110 and 120 of the display panel 100. The panel lead units 510 and 520 may include leads corresponding to the pads of the panel pad units 110 and 120, respectively. The area of each of the leads may be less than or equal to the area of the respective pads. The panel lead unit may include a first column and a second column. The first column of the panel lead units 510 may include a first panel inspection pad 511, a second panel inspection pad 512, a third panel inspection pad 514 and a first panel dummy pad 513. The second column of the panel lead units 520 may include a fourth panel inspection pad 521, a fifth panel inspection pad 522, a sixth panel inspection pad 524 and a second panel dummy pad 523.

The PCB lead unit 530 may be electrically connected to the PCB pad unit 310 of the driving circuit board 300. The PCB lead unit 530 may include leads corresponding to the pads of the PCB pad unit 310, respectively. The area of each of the leads may be less than or equal to the area of the respective pads. The PCB lead unit 530 may include first to eighth PCB inspection pads 531, 532, 533, 534, 535, 536, 537 and 538.

The film lines 541, 542, 543, 544, 545, 546, 547 and 548 may be disposed on the COF film 500. The film lines 541, 542, 543, 544, 545, 546, 547 and 548 may connect the PCB lead unit 530 with the panel lead units 510 and 520. The first to eighth film lines 541, 542, 543, 544, 545, 546, 547 and 548 may be connected to the first to eighth PCB inspection leads 531, 532, 533, 534, 535, 536, 537 and 538, respectively. Referring to FIG. 4, the first film line 541 may be connected to the third panel inspection lead 514. The second film line 542 may be connected to the second panel inspection lead 512. The third film line 543 may be connected to the second panel inspection lead 512. The second panel inspection lead 512 may be connected to the second film line 542 and the third film line 543. The fourth film line 544 may be connected to the first panel inspection lead 511. The fifth film line 545 may be connected to the fourth panel inspection lead 521. The sixth film line 546 may be connected to the fifth panel inspection lead 522. The seventh film line 547 may be connected to the fifth panel inspection lead 522. The fifth panel inspection lead 522 may be connected to the sixth film line 546 and the seventh film line 547. The eighth film line 548 may be connected to the sixth panel inspection lead 524. The film lines connected to the second panel inspection lead 512 and the fifth panel inspection lead 522 may have branches.

The first panel dummy lead 513 and the second panel dummy lead 523 may be connected to none of the film lines. The first panel dummy lead 513 may be disposed between the second panel inspection lead 512 and the third panel inspection lead 514 to allow the second panel inspection lead 512 to be easily positioned. The second panel dummy lead 523 may be disposed between the fourth panel inspection lead 521 and the fifth panel inspection lead 523 to allow the fifth panel inspection lead 522 to be easily positioned.

Figure 5:
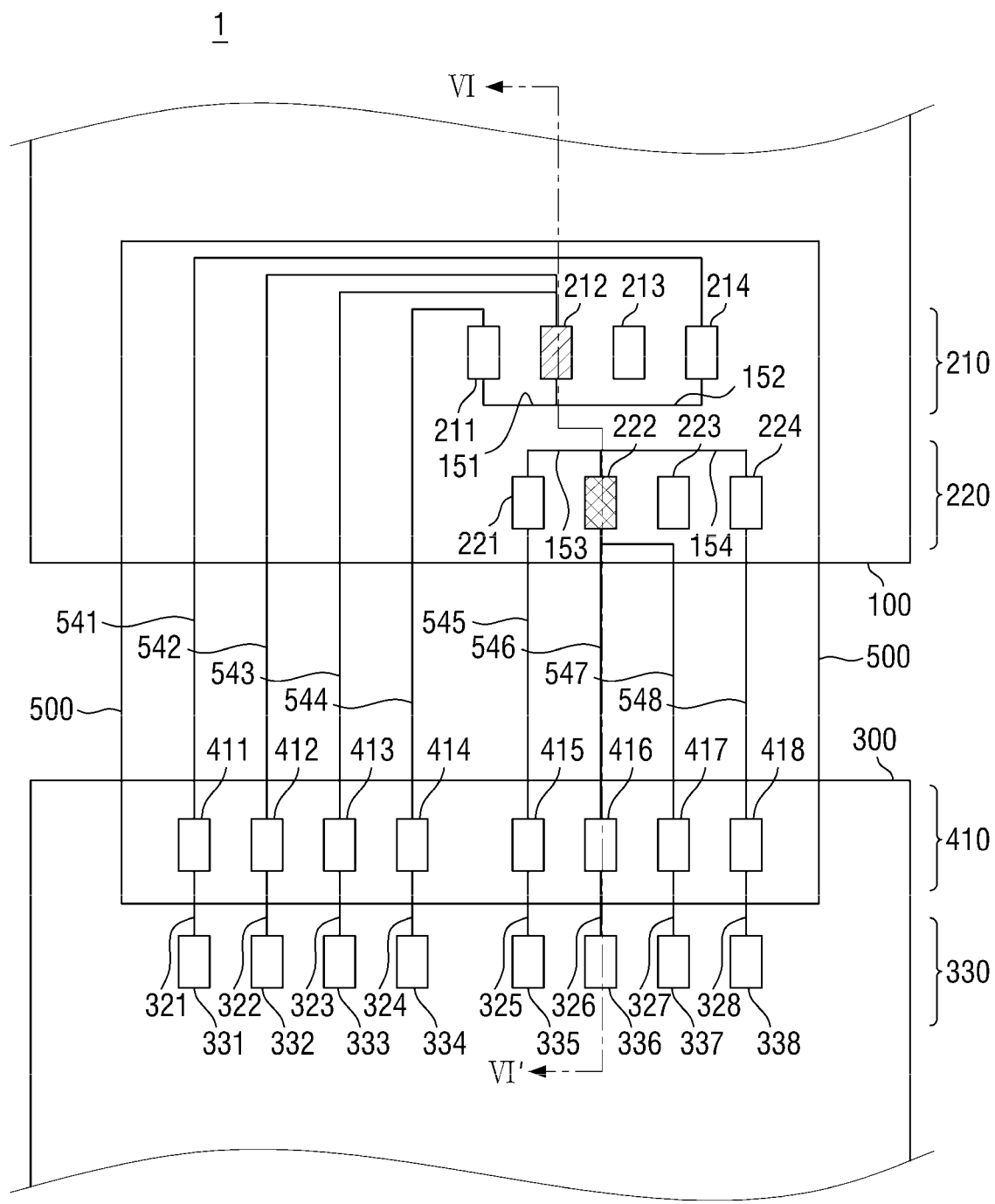
FIG. 5 is a plan view of the connections between the display panel and driving circuit in FIG. 1.
Figure 6:
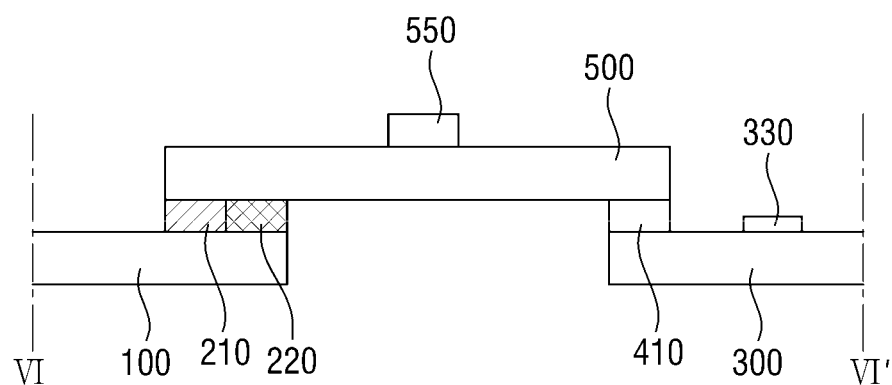
FIG. 6 is a cross-sectional view taken along line VI-VI' of FIG. 5.

FIG. 5 is a plan view of the connections between the display panel and driving circuit in FIG. 1. FIG. 6 is a cross-sectional view taken along line VI-VI' of FIG. 5.

FIG. 5 shows a display device 1 after the display panel 100, the COF film 500, and the driving circuit board 300 are pressed and attached together. In FIG. 5, the drive integrated circuit 550 chip is not shown for convenience of illustration. Although FIG. 6 does not show the lines, the lines may be disposed on the display panel, the COF film, and the driving circuit board.

The display panel 100 and the COF film 500 may be connected via an OLB (outer lead bonding) process. The display panel 100 and the COF film 500 may be attached together by disposing the anisotropic conductive film between the leads and the pads and pressing them together to electrically connect them. The panel inspection pads of the panel pad units 110 and 120 and the panel inspection leads of the panel lead units 510 and 520 may be coupled with one another respectively by a first anisotropic conductive film 601 (see FIG. 1), to form OLB areas 210 and 220 including first to sixth OLB coupling portions 211, 212, 214, 221, 222 and 224.

The first OLB area 210 may include a first OLB coupling portion 211, a second OLB coupling portion 212, a third OLB coupling portion 214 and a first dummy coupling portion 213. The second OLB area 220 may include a fourth OLB coupling portion 221, a fifth OLB coupling portion 222, a sixth OLB coupling portion 224 and a second dummy coupling portion 223. An OLB connection resistance is generated between the panel inspection pads and the panel inspection leads coupled by the first anisotropic conductive film 601. If the OLB connection resistance deviates from a predetermined range, there may be a defect in the display device 1.

The COF film 500 and the driving circuit board 300 may be connected in the form of a film-on-film (FOF) to form an FOF area 410. The FOF area 410 may be formed by disposing a second anisotropic conductive film 602 (see FIG. 1) between the PCB lead unit 530 of the COF film 500 and the PCB pad unit 310 of the driving circuit board 300 and pressing them together.

The FOF area 410 may include first to eighth FOF coupling portions 411, 412, 413, 414, 415, 416, 417 and 418. The first to eighth FOF coupling portions 411, 412, 413, 414, 415, 416, 417 and 418 may be electrically connected to the first to eighth test pads 331, 332, 333, 334, 335, 336, 337 and 338 via the first to eighth PCB lines 321, 322, 323, 324, 325, 326, 327 and 328, respectively. An FOF connection resistance is generated between the PCB inspection pads and the PCB inspection leads coupled by the anisotropic conductive film.

Figure 7:
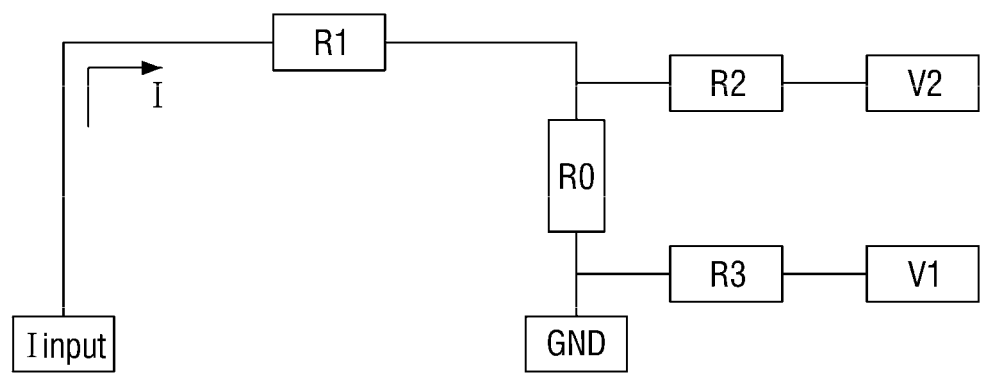
FIG. 7 is a circuit diagram for illustrating four-terminal sensing according to the principles of the invention.

FIG. 7 is a circuit diagram for illustrating four-terminal sensing according to an exemplary embodiment of the invention.

The circuit diagram of FIG. 7 shows a constant current source $I_{input}$, a ground contact portion GND, voltage measurement portions V1 and V2, a subject resistor R0 to be tested and noise resistors R1, R2 and R3 for four-terminal sensing. According to the four-terminal sensing, it is possible to accurately measure the resistance of the subject resistor even if there is a noise resistance.

Referring to FIG. 7, when a constant current I flows from the constant current source $I_{input}$, the current I may flow toward the ground contact portion GND. As the current I flows, a voltage is applied across the noise resistor R1 and across the subject resistor R0. The voltage has the value V=I*R according to Ohm's law. Since no current flows through the noise resistor R2 and the noise resistor R3, no voltage is applied across them. By measuring the voltage difference between the voltage measurement portions V1 and V2, it is possible to determine the voltage across the subject resistor R0. The difference in the voltage across the subject resistor R0 is equal to V2−V1, which is equal to I*R0. Therefore, by dividing the voltage difference V2−V1 by the current value, it is possible to accurately measure the resistance of R0 according to Equation below:

$$R0=(V2-V1)/I \qquad \text{<Equation>}$$

Therefore, it is possible to measure the accurate resistance regardless of the voltage applied across the noise resistor R1.

Figure 8:
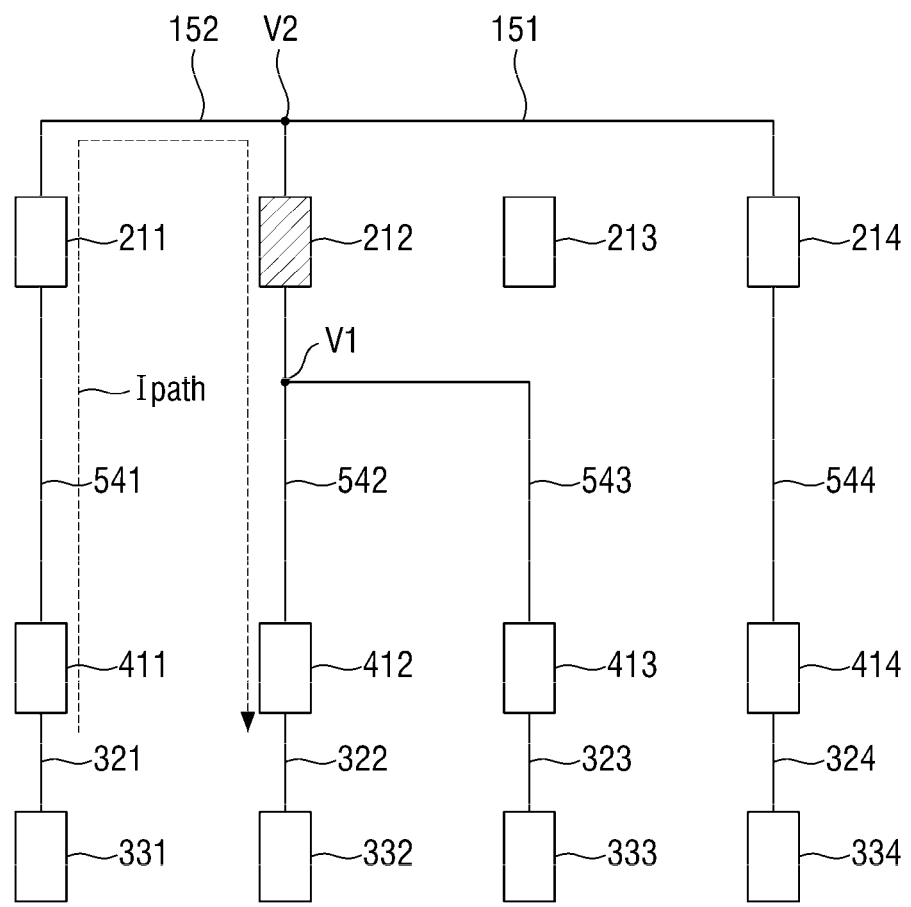
FIG. 8 is a circuit diagram for measuring the connection resistance of the second OLB coupling portion according to an exemplary embodiment of the invention.

FIG. 8 is a circuit diagram for measuring the connection resistance of the second OLB coupling portion according to an exemplary embodiment of the invention. Referring to FIG. 8, the circuit diagram includes a first OLB area, an FOF area, test pads, and various lines. The first OLB area includes first to third OLB coupling portions 211, 212 and 214 and a first dummy coupling portion 213. The subject resistance to be measured in order to check if the OLB process has been properly carried out is the resistance of the second OLB coupling portion 212.

To measure the resistance of the second OLB coupling portion 212, the first test pad 331 may be a constant current source. The second test pad 332 may be a ground contact portion. The third test pad 333 and the fourth test pad 334 may be voltage measurement portions. A current may flow from the first test pad 331 to the second test pad 332. The current path $I_{path}$ may include a first test pad 331, a first PCB line 321, a first FOF coupling portion 411, a first film line 541, a first OLB coupling portion 211, a second panel line 152, a second OLB coupling portion 212, a second film line 542, a second FOF coupling portion 412, a second PCB line 322, and a second test pad 332 in this order.

Voltages are applied across the lines 321, 541, 152, 542 and 322 and the coupling portions 411, 211, 212 and 412 located on the current path $I_{path}$ as current flows therethrough. No voltage is applied across the lines 151, 323, 324, 543 and 544 and the coupling portions 213, 214, 413 and 414 located outside the current path $I_{path}$. Accordingly, no voltage is applied across the first dummy coupling portion 213, the third OLB coupling portion 214, the third FOF coupling portion 413 and the fourth FOF coupling portion 414 which work as noise resistors, and the lines 151, 323, 324, 543 and 544 connecting them. To measure the voltage across the second OLB coupling portion 212, the voltage at the third test pad 333 and the voltage at the fourth test pad 334 may be measured. When the voltage at the third test pad 333 and the voltage at the fourth test pad 334 are measured, it is possible to accurately measure the voltage difference across the second OLB coupling portion 212 (V1, V2) since no voltage is applied to the noise resistors.

By measuring the voltages at the third test pad 333 and the fourth test pad 334 to calculate the voltage difference across the second OLB coupling portion 212, and then dividing it by the current value flowing through the first test pad 331, it is possible to measure the connection resistance of the second OLB coupling portion 212 according to Ohm's law. If the measured connection resistance of the second OLB coupling portion 212 deviates from a predetermined range, it may be determined that the OLB process has not been properly carried out.

Figure 9:
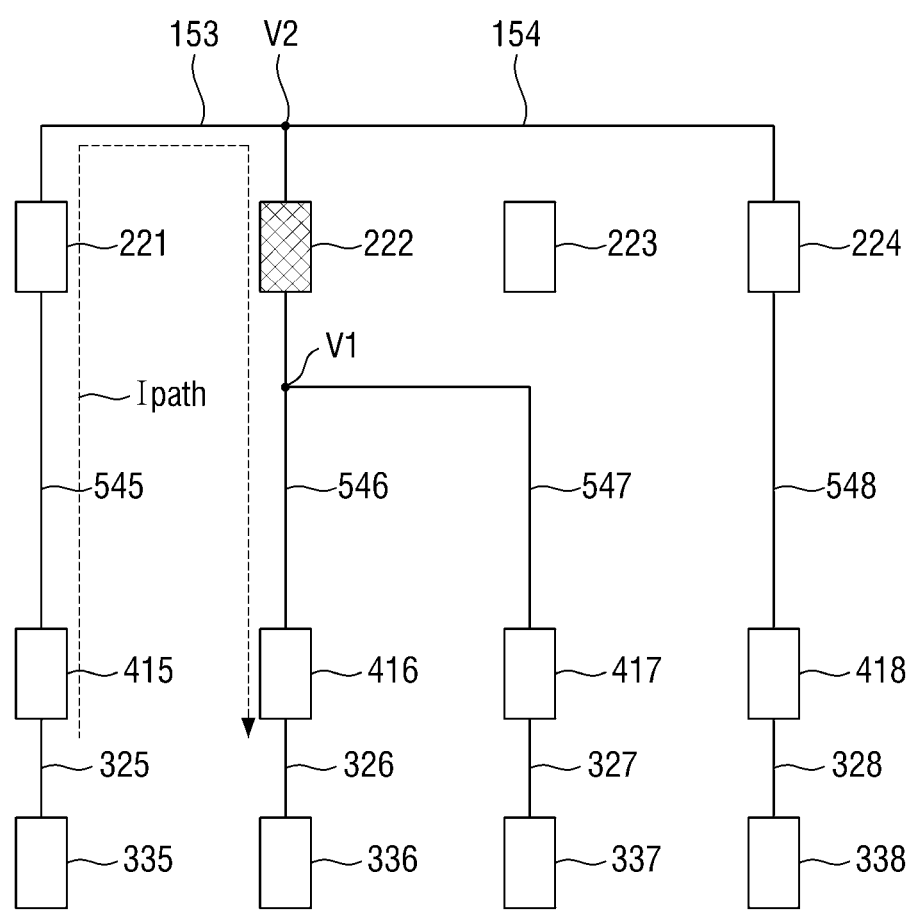
FIG. 9 is a circuit diagram for measuring the connection resistance of a fifth OLB coupling portion according to an exemplary embodiment of the invention.

FIG. 9 is a circuit diagram for measuring the connection resistance of a fifth OLB coupling portion according to an exemplary embodiment of the invention.

Referring to FIG. 9, the circuit diagram includes a second OLB area, an FOF area, test pads, and various lines. The second OLB area includes fourth to sixth OLB coupling portions 221, 222 and 224 and a second dummy coupling portion 223. The subject resistance to be measured in order to check if the OLB process has been properly carried out is the resistance of the fifth OLB coupling portion 222.

To measure the resistance of the fifth OLB coupling portion 222, the fifth test pad 335 may be a constant current source. The sixth test pad 336 may be a ground contact portion. The seventh test pad 337 and the eighth test pad 338 may be voltage measurement portions. A current may flow from the fifth test pad 335 to the sixth test pad 336. The current path $I_{path}$ may include a fifth test pad 335, a fifth PCB line 325, a fifth FOF coupling portion 435, a fifth film line 545, a fourth OLB coupling portion 221, a third panel line 153, a fifth OLB coupling portion 222, a sixth film line 546, a sixth FOF coupling portion 416, a sixth PCB line 326, and a sixth test pad 336 in this order.

Since no voltage is applied across the noise resistors located outside the current path $I_{path}$, by measuring the voltage at the seventh test pad 337 and the voltage at the eighth test pad 338, it is possible to accurately measure the voltage difference across the fifth OLB coupling portion 222 (V1, V2).

By measuring the voltages at the seventh test pad 337 and the eighth test pad 338 to calculate the voltage difference across the fifth OLB coupling portion 222 (V2–V1), and then dividing it by the current value flowing through the fifth test pad 335, it is possible to measure the connection resistance of the fifth OLB coupling portion 222 according to Ohm's law. If the measured connection resistance of the fifth OLB coupling portion 222 deviates from a predetermined range, it may be determined that the OLB process has not been properly carried out.

In this manner, the resistance of the second OLB coupling portion 212 and the fifth OLB coupling portion 222 can be measured individually, to check if the first OLB area and the second OLB area have been properly attached.

Figure 10:
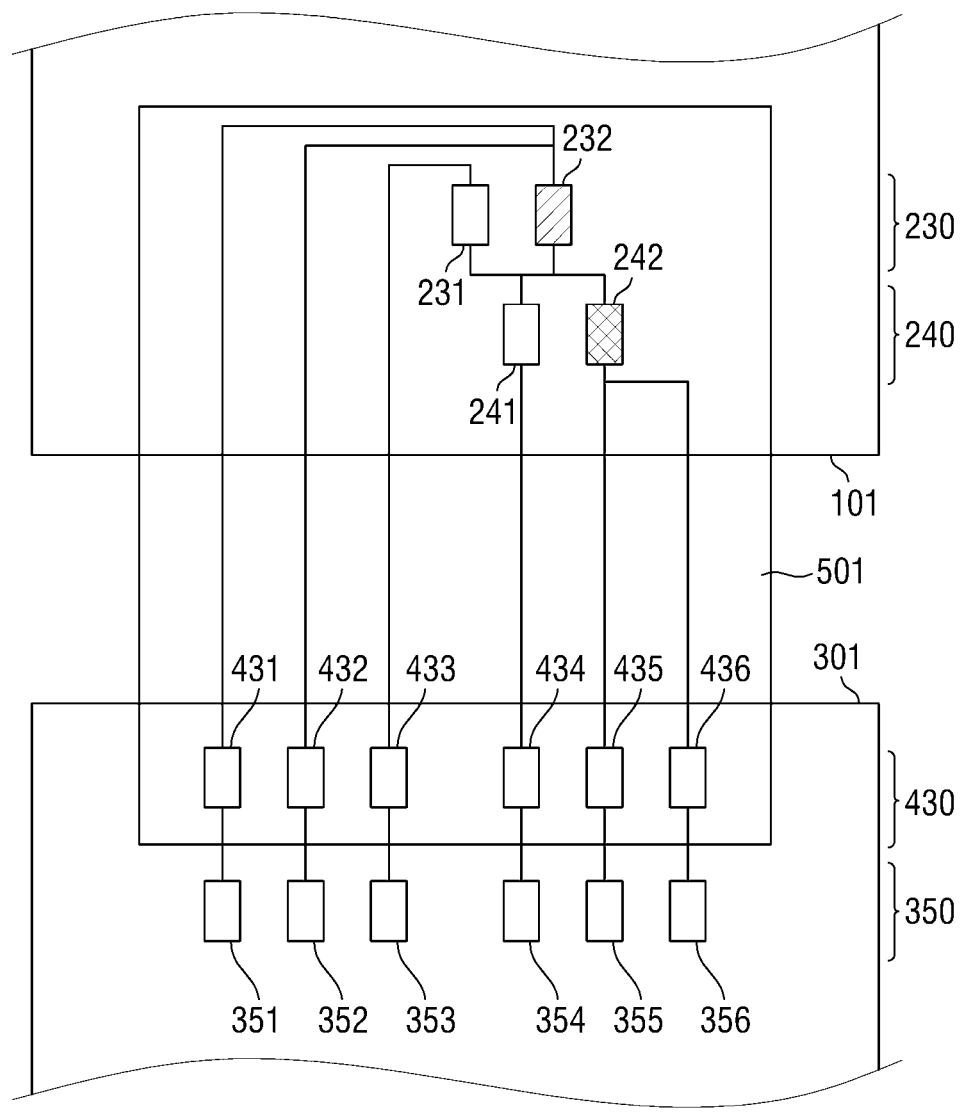
FIG. 10 is a plan view of the connections between a display panel and a driving circuit of a display device according to another exemplary embodiment of the invention.

FIG. 10 is a plan view of the connections between a display panel and a driving circuit of a display device according to another exemplary embodiment of the invention.

Referring to FIG. 10, a display device 2 may include a display panel 101, a driving circuit board 301, and a COF film 501.

The display panel 101 and the COF film 501 may be coupled with each other via an OLB process to form a first OLB area 230 and a second OLB area 240. The first OLB area 230 may include a first OLB coupling portion 231 and a second OLB coupling portion 232. The second OLB area 240 may include a third OLB coupling portion 241 and a fourth OLB coupling portion 242. An OLB connection resistance is generated in each of the OLB coupling portions.

By measuring the OLB connection resistance at the OLB coupling portion, it is possible to check if the OLB process has been properly carried out. The first to fourth OLB coupling portions 231, 232, 241 and 242 may be connected to one another through panel lines disposed on the display panel 101.

The driving circuit board 301 and the COF film 501 may be coupled with each other in the form of a film-on-film, to form an FOF area 430. The FOF area 430 may include first to sixth FOF coupling portions 431, 432, 433, 434, 435 and 436. The FOF connection resistance is generated in the first to sixth FOF coupling portions 431, 432, 433, 434, 435 and 436. The first to sixth FOF coupling portions 431, 432, 433, 434, 435 and 436 may be connected to the first to sixth test pads 351, 352, 353, 354, 355 and 356 disposed on the driving circuit board, respectively. The FOF coupling portions may be connected to the test pads through the PCB lines disposed on the driving circuit board 301.

The first to fourth OLB coupling portions 231, 232, 241 and 242 may be connected to the first to sixth FOF coupling portions 431, 432, 433, 434, 435 and 436 through the film lines on the COF film 501. Referring to FIG. 10, the first OLB coupling portion 231 may be connected to the third FOF coupling portion 433. The second OLB coupling portion 232 is connected to a first FOF coupling portion 431 and a second FOF coupling portion 432 through the lines including branches. The third OLB coupling portion 241 is connected to the fourth FOF coupling portion 434. The fourth OLB coupling portion 242 is connected to a fifth FOF coupling portion 435 and a sixth FOF coupling portion 436 through the lines including branches.

It is possible to check if the first OLB area 230 is properly attached by measuring the resistance of the second OLB coupling portion 232. It is possible to check if the second OLB area 240 is properly attached by measuring the resistance of the fourth OLB coupling portion 242.

Figure 11:
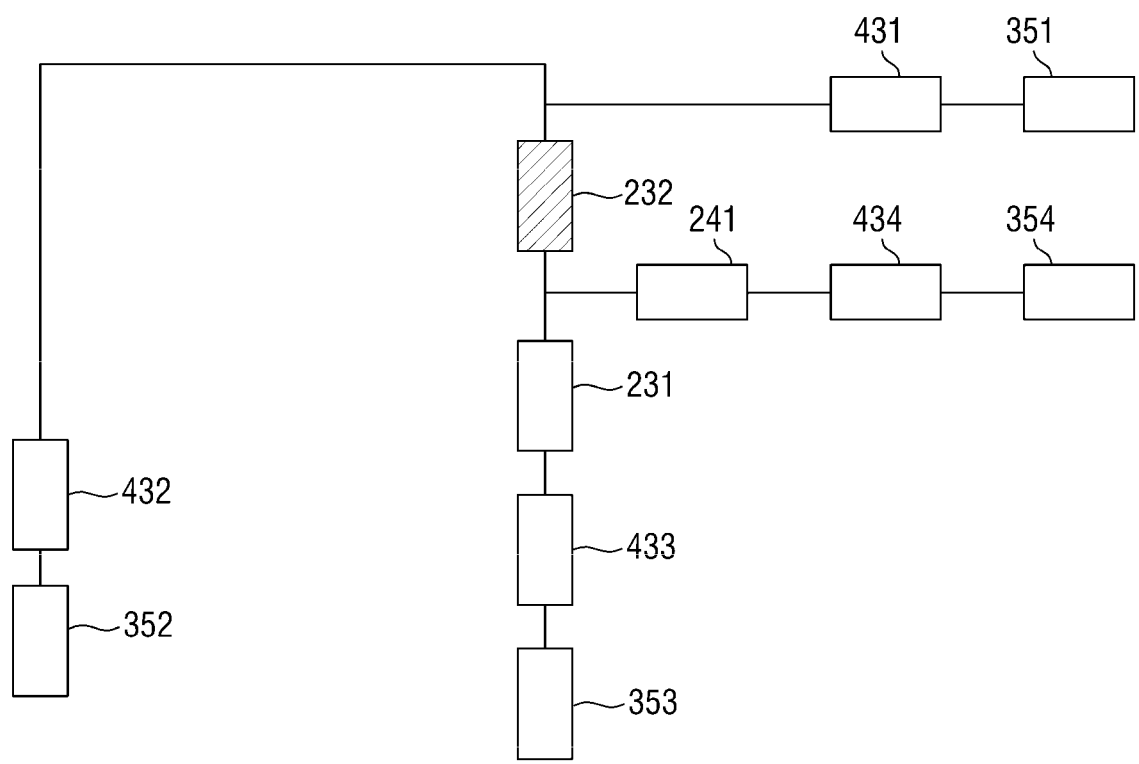
FIG. 11 is a circuit diagram for measuring the connection resistance of a second OLB coupling portion according to another exemplary embodiment of the invention.

FIG. 11 is a circuit diagram for measuring the connection resistance of a second OLB coupling portion according to another exemplary embodiment of the invention.

Referring to FIG. 11, the circuit diagram includes OLB coupling portions 231, 232 and 241, FOF coupling portions 431, 432, 433 and 434, test pads 351, 352, 353 and 354, and various lines. The subject resistance to be measured in order to check if the first OLB area has been properly attached is the resistance of the second OLB coupling portion 232.

To measure the resistance of the second OLB coupling portion 232, the second test pad 352 may be a constant current source. The third test pad 353 may be a ground contact portion. The first test pad 351 and the fourth test pad 354 may be voltage measurement portions. A current may flow from the second test pad 352 to the third test pad 353. The current path may include a second test pad 352, a second FOF coupling portion 432, a second OLB coupling portion 232, a first OLB coupling portion 231, a third FOF coupling portion 433, a third test pad 353 and lines connecting them.

A voltage is applied to the lines and the coupling portions located on the current path as current flows therethrough. That No voltage is applied to the lines and the coupling portions located outside the current path. Accordingly, no voltage is applied to the third OLB coupling portion 241, the first FOF coupling portion 431 and the fourth FOF coupling portion 434 which work as noise resistors. To measure the voltage across the second OLB coupling portion 232, the voltage at the first test pad 351 and the voltage at the fourth test pad 354 may be measured. When the voltage at the first test pad 351 and the voltage at the fourth test pad 354 are measured, it is possible to accurately measure the voltage difference across the second OLB coupling portion 232 since no voltage is applied to the noise resistors.

By measuring the voltages at the first test pad 351 and the fourth test pad 354 to calculate the voltage difference across the second OLB coupling portion 232, and then dividing it by the current value flowing through the second test pad 352, it is possible to measure the connection resistance of the second OLB coupling portion 232 according to Ohm's law. If the measured connection resistance of the second OLB coupling portion 232 deviates from a predetermined range, it may be determined that the OLB process has not been properly carried out.

Figure 12:
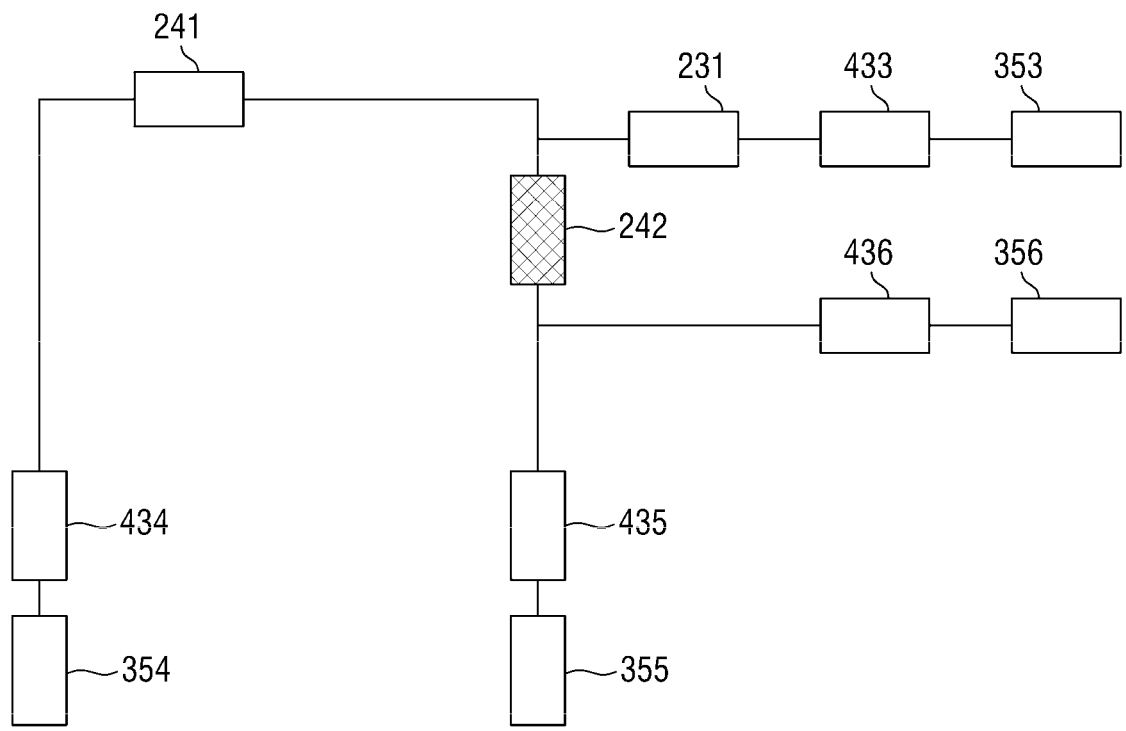
FIG. 12 is a circuit diagram for measuring the connection resistance of a fourth OLB coupling portion according to another exemplary embodiment of the invention.

FIG. 12 is a circuit diagram for measuring the connection resistance of a fourth OLB coupling portion according to another exemplary embodiment of the invention.

Referring to FIG. 12, the circuit diagram includes an OLB coupling portion, an FOF coupling portion, test pads, and various lines. The subject resistance to be measured in order to check if a second OLB area 240 has been properly attached is the resistance of a fourth OLB coupling portion 242.

To measure the resistance of the fourth OLB coupling portion 242, the fourth test pad 354 may be a constant current source. The fifth test pad 355 may be a ground contact portion. The third test pad 353 and the sixth test pad 356 may be voltage measurement portions. A current may flow from the fifth test pad 354 to the fifth test pad 355. The current path may include a fourth test pad 354, a fourth FOF coupling portion 434, a third OLB coupling portion 241, a fourth OLB coupling portion 242, a fifth FOF coupling portion 435, a fifth test pad 355 and lines connecting them.

A voltage is applied to the lines and the coupling portions located on the current path as current flows therethrough. No voltage is applied to the lines and the coupling portions located outside the current path. Accordingly, no voltage is applied to the first OLB coupling portion 231, the fourth FOF coupling portion 433 and the fifth FOF coupling portion 435 which work as noise resistors. To measure the voltage across the fourth OLB coupling portion 242, the voltage at the third test pad 353 and the voltage at the sixth test pad 356 may be measured. When the voltage at the third test pad 353 and the voltage at the sixth test pad 356 are measured, it is possible to accurately measure the voltage difference across the fourth OLB coupling portion 242 since no voltage is applied to the noise resistors.

By measuring the voltages at the third test pad 353 and the sixth test pad 356 to calculate the voltage difference across the fourth OLB coupling portion 242, and then dividing it by the current value flowing through the fourth test pad 352, it is possible to measure the connection resistance of the fourth OLB coupling portion 242 according to Ohm's law. If the measured connection resistance of the fourth OLB coupling portion 242 deviates from a predetermined range, it may be determined that the OLB process has not been properly carried out.

Figure 13:
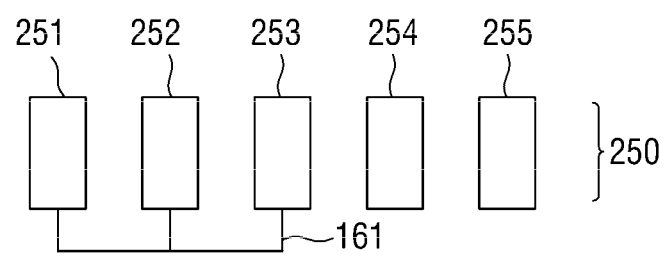
FIGS. 13, 14 and 15 area views of pad structures of display panels according to yet another exemplary embodiment of the invention.

FIG. 13 is a view of a pad structure of a display panel according to yet another exemplary embodiment of the invention. The exemplary embodiment shown in FIG. 13 illustrates an example in which the panel inspection pads 251, 252 and 253 are disposed adjacent to one another. Although not shown in FIG. 13, panel inspection leads and panel dummy leads are formed on the COF film that correspond to the panel inspection pads and the panel dummy pads, respectively, to form the OLB area. The OLB area and the FOF area may be formed and the OLB may be checked in the same manner as in the above-described exemplary embodiments.

FIG. 13 shows a panel pad unit 250 and panel lines 161 according to yet another exemplary embodiment of the invention. The panel pad unit 250 may include first to third panel inspection pads 251, 252, and 253. A first panel dummy pad 254 and a second panel dummy pad 255 may not be connected to a panel line 161.

According to this exemplary embodiment, the arrangement of the first to third panel inspection pads 251 to 253, the first panel dummy pad 254 and the second panel dummy pad 255 of the panel pad unit 250 is different from that of the above-described exemplary embodiment. The panel dummy pads 254 and 255 may not be used to check the OLB of the display device but may be used to allow the panel inspection pads 251, 252 and 253 to be easily arranged. Accordingly, according to this exemplary embodiment, the panel inspection pads 251, 252 and 253 are disposed adjacent to one another, and the panel dummy pads 254 and 255 are not included among the panel inspection pads 251, 252 and 253. The arrangement of the pads may be varied in a number of ways due to various lines formed on the display panel, the COF film, and the driving circuit board. The four-terminal sensing technique according to any of the above-described exemplary embodiments may be applied by disposing the panel inspection pads 251, 252 and 253 adjacent to each other. As a result, the space in the display device required for checking the OLB can be reduced.

Although the first column of the panel pad unit according to the exemplary embodiment of the invention has been described, the same can be equally applied to the first and second columns of the panel pad units according to any of the above-described exemplary embodiments of the invention.

Figure 14:
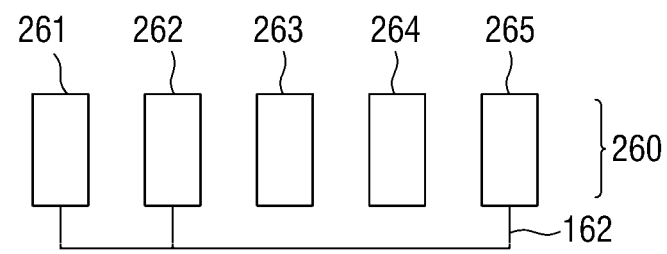

FIG. 14 is a view of a pad structure of a display panel according to yet another exemplary embodiment of the invention. The exemplary embodiment of FIG. 14 illustrates an example in which panel dummy pads 263 and 264 are disposed between panel inspection pads 261, 262 and 265. Although not shown in FIG. 14, panel inspection leads and panel dummy leads are formed on the COF film that correspond to the panel inspection pads and the panel dummy pads, respectively, to form the OLB area. The OLB area and the FOF area may be formed and the OLB may be checked in the same manner as in the above-described exemplary embodiments.

FIG. 14 shows a panel pad unit 260 and a panel line 162 according to yet another exemplary embodiment of the invention. The panel pad unit 260 may include first to third panel inspection pads 261, 262, and 265. A first panel dummy pad 263 and a second panel dummy pad 264 may not be connected to a panel line 162.

According to this exemplary embodiment, the arrangement of the first to third panel inspection pads 261, 262 and 265, the first panel dummy pad 262 and the second panel dummy pad 265 of the panel pad unit 260 is different from that of the above-described exemplary embodiment. The panel dummy pads 263 and 264 may not be used to check the OLB of the display device but may be used to allow the panel inspection pads 261, 262 and 265 to be easily arranged. Accordingly, according to this exemplary embodiment, the panel dummy pads 263 and 264 are disposed between the second panel inspection pad 262 and the third panel inspection pad 265. Although the panel dummy pads 263 and 264 are disposed between the second panel inspection pad 262 and the third panel inspection pad 265 in this exemplary embodiment, this is merely illustrative. The panel dummy pads 263 and 264 may be disposed between the first panel inspection pad 261 and the second panel inspection pad 262. The arrangement of the pads may be varied in a number of ways due to various lines formed on the display panel, the COF film, and the driving circuit board. Accordingly, although the two panel dummy pads are disposed between the panel inspection pads 261, 262 and 265 in this exemplary embodiment, three or more panel dummy pads may be disposed depending on the arrangement of the pads. As display devices have higher and higher resolution, finer pad structure is required. As a result, the structure of pads and lines becomes further refined. Therefore, in order to prevent short-circuit and disconnection in such fine structure, a panel dummy pad may be disposed between the panel inspection pads to effectively utilize the reduced space.

Although the first column of the panel pad unit according to the exemplary embodiment of the invention has been described, the same can be equally applied to all kinds of panel pad units including the first and second columns of the panel pad units according to any of the above-described exemplary embodiments of the invention.

Figure 15:
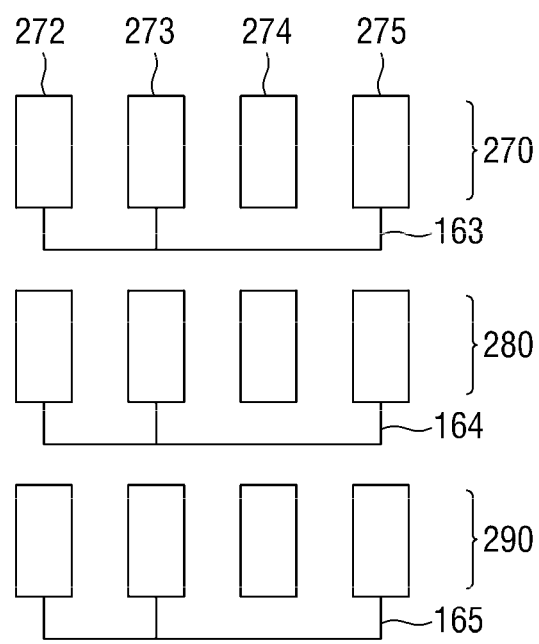

FIG. 15 is a view of a pad structure of a display panel according to yet another exemplary embodiment of the invention. The exemplary embodiment shown in FIG. 15 illustrates a panel pad structure including first to third panel pad units 270, 280 and 290. The first panel pad unit 270 may include first to third panel inspection pads 272, 273 and 275 and a first panel dummy pad 274. The first panel dummy pad 274 may not be connected to a first panel line 163.

FIG. 15 shows first to third panel pad units 270, 280 and 290 and panel lines 163, 164 and 165 according to yet another exemplary embodiment of the invention. Although the first to third panel pad units 270, 280 and 290 all include the same pad structure according to this exemplary embodiment of the invention, the first to third panel pad units 270, 280 and 290 may include different pad structures including those described above with reference to FIGS. 13 and 14. Although not shown in FIG. 15, panel inspection leads and panel dummy leads are formed on the COF film that correspond to the panel inspection pads and the panel dummy pads, respectively, to form the OLB area. In addition, a test pad unit including ninth to twelfth test pads for checking the OLB of the third panel pad unit may be disposed on the driving circuit board. The OLB area and the FOF area may be formed and the OLB may be checked in the same manner as in the above-described exemplary embodiments.

According to this exemplary embodiment, the panel pad structure may include three or more columns. As display devices have higher and higher resolution, finer pad structure is required. By implementing the panel pad units having three or more columns, it is possible to deliver more information. In addition, in the panel pad structure having three or more columns, it is possible to check if the OLB process has been properly carried out by apply the four-terminal sensing.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
 a display panel having panel pad units including a first panel pad unit having first pads arranged in a first column and a second panel pad unit having second pads arranged in a second column;
 a first member coupled to at least one of the first and second panel pad units; and
 a second member coupled to the first member and including a plurality of test pads, and
 wherein the first member comprises lines electrically connecting a respective one of the plurality of test pads with a respective one of the first and second pads,
 wherein the first panel pad unit comprises a first panel inspection pad, a second panel inspection pad and a third panel inspection pad, and wherein the second panel pad unit comprises a fourth panel inspection pad, a fifth panel inspection pad and a sixth panel inspection pad, and wherein:
 the first panel inspection pad, the second panel inspection pad and the third panel inspection pad are connected to a first panel line, and
 the fourth panel inspection pad, the fifth panel inspection pad and the sixth panel inspection pad are connected to a second panel line.

2. The display device of claim 1, wherein the first member comprises a first film, the second member comprises a second film, and the first pads arranged in the first panel pad unit and the second pads arranged in the second panel pad unit are electrically connected to different test pads of the plurality of test pads, respectively.

3. The display device of claim 2, further comprising: a third panel pad unit comprising third pads arranged in a third column.

4. The display device of claim 2, wherein the first panel pad unit further comprises a first panel dummy pad, and wherein the second panel pad unit further comprises a second panel dummy pad.

5. The display device of claim 4, wherein the first panel dummy pad is disposed adjacent to the second panel inspection pad, and wherein the second panel dummy pad is disposed adjacent to the fifth panel inspection pad.

6. The display device of claim 5, wherein the first panel dummy pad is disposed between the second panel inspection pad and the third panel inspection pad, and wherein the second panel dummy pad is disposed between the fifth panel inspection pad and the sixth panel inspection pad.

7. The display device of claim 4, wherein the first panel dummy pad is not connected to the plurality of first and second pads, and wherein the second panel dummy pad is not connected to the plurality of first and second pads.

8. The display device of claim 4, wherein the second panel inspection pad is connected to a line having branches, and wherein the fifth panel inspection pad is connected to another line having branches.

9. The display device of claim 2, wherein the plurality of test pads are not coupled with the first member and include an exposed portion.

10. The display device of claim 1, wherein the test pads electrically connected to the first panel pad unit are connected to a first constant current source, a first ground contact portion, a first voltage measurement portion and a second voltage measurement portion, and wherein the test pads electrically connected to the second panel pad unit are connected to a second constant current source, a second ground contact portion, a third voltage measurement portion, and a fourth voltage measurement portion.

11. The display device of claim 1, wherein at least two of the plurality of test pads are capable of being in contact with two or more measurement terminals.

12. A display device comprising:
a display panel having a plurality of test pads;
an integrated circuit to drive the display panel;
a connector electrically communicating the display panel and the integrated circuit;
a first test pad of the plurality of test pads being connected to a first constant current source, a second test pad of the plurality of test pads being connected to a first ground contact portion, a third test pad of the plurality of test pads comprises a first voltage measurement portion, and a fourth test pad of the plurality of test pads comprises a second voltage measurement portion,
panel pad units comprising a first panel pad unit having first pads arranged in a first column, and a second panel pad unit having second pads arranged in a second column, the first panel pad unit further comprises a first panel dummy pad, and wherein the second panel pad unit further comprises a second panel dummy pad, the first panel dummy pad being disposed adjacent to a panel inspection pad comprising a first panel inspection pad, a second panel inspection pad, a third panel inspection pad, and a fourth panel inspection pad, and wherein:
the second panel dummy pad is disposed adjacent to the fourth panel inspection pad,
the first panel inspection pad, the second panel inspection pad, the third panel inspection pad, and the fourth panel inspection pad are connected to one another through panel lines.

13. The display device of claim 12, wherein the integrated circuit comprises a first film, and the connector comprises a second film.

14. The display device of claim 12, wherein the first panel dummy pad is not connected to the plurality of first and second pads, and wherein the second panel dummy pad is not connected to the plurality of first and second pads.

15. The display device of claim 14, wherein the second panel inspection pad is connected to a line having branches, and wherein the fourth panel inspection pad is connected to another line having branches.

16. The display device of claim 12 further comprises a first member coupled to the first panel pad unit, wherein the test pads are not coupled with the first member and include an exposed portion.

17. The display device of claim 16, wherein at least two of the plurality of test pads are capable of being in contact with two or more measurement terminals.

* * * * *